United States Patent [19]

Yokono et al.

[11] Patent Number: 5,569,545
[45] Date of Patent: Oct. 29, 1996

[54] COPPER CLAD LAMINATE, MULTILAYER PRINTED CIRCUIT BOARD AND THEIR PROCESSING METHOD

[75] Inventors: Hitoshi Yokono, Toride; Haruki Yokono, Yono; Masahiro Mikamo; Ryouichi Narushima, both of Shimodate; Takuya Iida, Yuuki; Yasuhiro Endo, Shimodate, all of Japan

[73] Assignee: Nippon Denkai Ltd., Tokyo, Japan

[21] Appl. No.: 365,081

[22] Filed: Dec. 28, 1994

[30] Foreign Application Priority Data

| Dec. 28, 1993 | [JP] | Japan | 5-349194 |
| Mar. 28, 1994 | [JP] | Japan | 60-79197 |
| Oct. 27, 1994 | [JP] | Japan | 6-263816 |

[51] Int. Cl.⁶ ............................... B32B 15/08
[52] U.S. Cl. ............................... 428/626; 428/462
[58] Field of Search ............... 428/626, 647, 428/652, 671, 675, 676, 642, 662, 663, 665, 666, 668, 670, 658, 660, 901, 607, 462, 461, 704, 681, 680, 673, 646, 643

[56] References Cited

U.S. PATENT DOCUMENTS

| 3,940,547 | 2/1976 | Needham et al. | 428/463 |
| 4,446,198 | 5/1984 | Shemenski et al. | 428/625 |
| 4,470,479 | 9/1984 | Inoue et al. | 181/168 |
| 4,935,310 | 6/1990 | Nakatsugawa | 428/607 |
| 5,217,599 | 6/1993 | Chen et al. | 205/196 |
| 5,332,486 | 7/1994 | Di Franco | 205/50 |
| 5,338,619 | 8/1994 | Fukuda et al. | 428/623 |
| 5,366,612 | 11/1994 | Clouser et al. | 205/73 |
| 5,366,814 | 11/1994 | Yamanishi et al. | 428/607 |

FOREIGN PATENT DOCUMENTS

| 1937548 | 2/1971 | Germany . |
| 51-57783 | 5/1976 | Japan . |
| 54-53180 | 4/1979 | Japan . |
| 56-19820 | 5/1981 | Japan . |
| 60-14836 | 4/1985 | Japan . |
| 63-315214 | 12/1988 | Japan . |
| 1113477 | 5/1989 | Japan . |
| 1-201454 | 8/1989 | Japan . |
| 3-111464 | 5/1991 | Japan . |

OTHER PUBLICATIONS

Haemas et al. "Steel Cord-rubber adhesion: State of the art" Rubber World, Vd182#6, Sep. 1980.
New English-Japanese Chemical Dictionary.
Kirk-Othmer, Encyclopedia of Chemical Technology, third edition, vol.13, pp. 772-774.
Kirk-Othmer, Encyclopedia of Chemical Technology, third edition, vol. 7, p. 104.
Purinto Kairo Gijutsu Binran (Printed Circuit Handbook, the 2nd version published by Nikkan Kogyo Shinbun Co., Ltd.) pp. 299 to 564.

*Primary Examiner*—David A. Simmons
*Assistant Examiner*—Linda L. Gray
*Attorney, Agent, or Firm*—Antonelli, Terry, Stout & Kraus

[57] ABSTRACT

A copper clad laminate having a bonded side ensuring powerful adhesion between the copper foil and insulating layer, without providing protrusions on the copper foil or making roughing treatment or black treatment, by designing such a configuration that the copper foil has a metal layer on the side to be bonded with the insulating layer and the metal layer and insulating layer are cross-linked with each other by chemical bonds through sulfur atoms. Further, there is provided a multilayer printed circuit board which has a bonded side ensuring a powerful adhesion of the circuit copper foil and insulating layer, by designing such a configuration that the alternating metal layers and insulating layers are cross-linked with each other by chemical bonds through sulfur atoms.

24 Claims, 1 Drawing Sheet

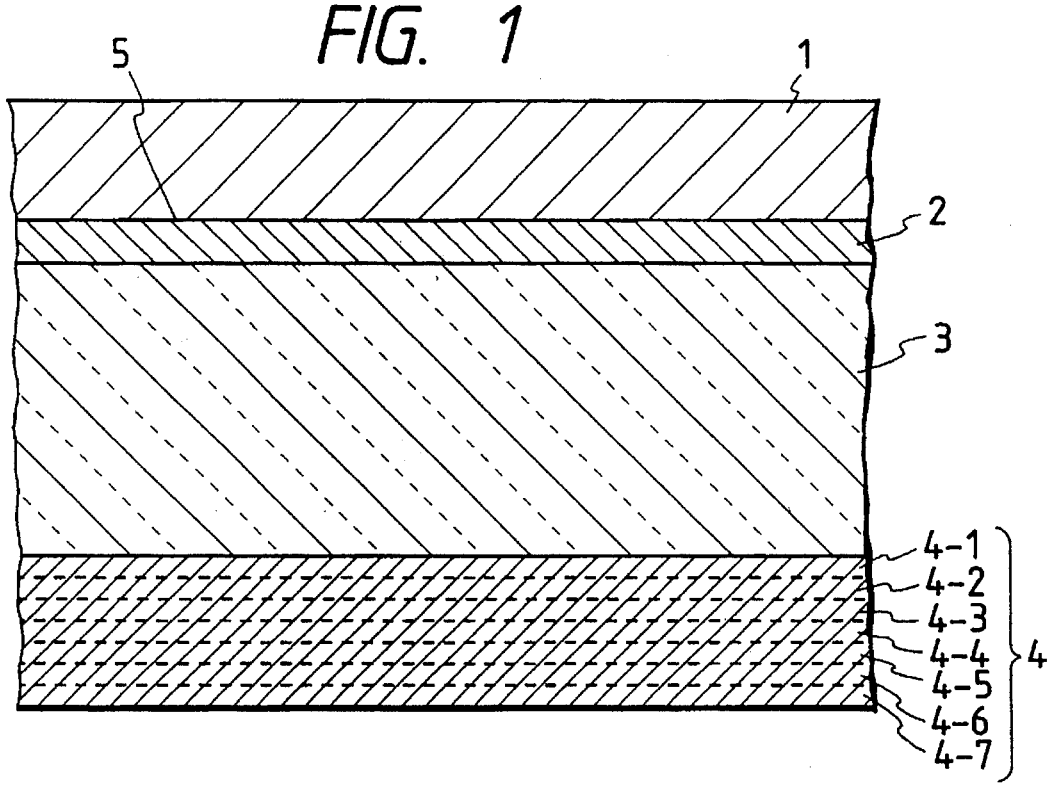
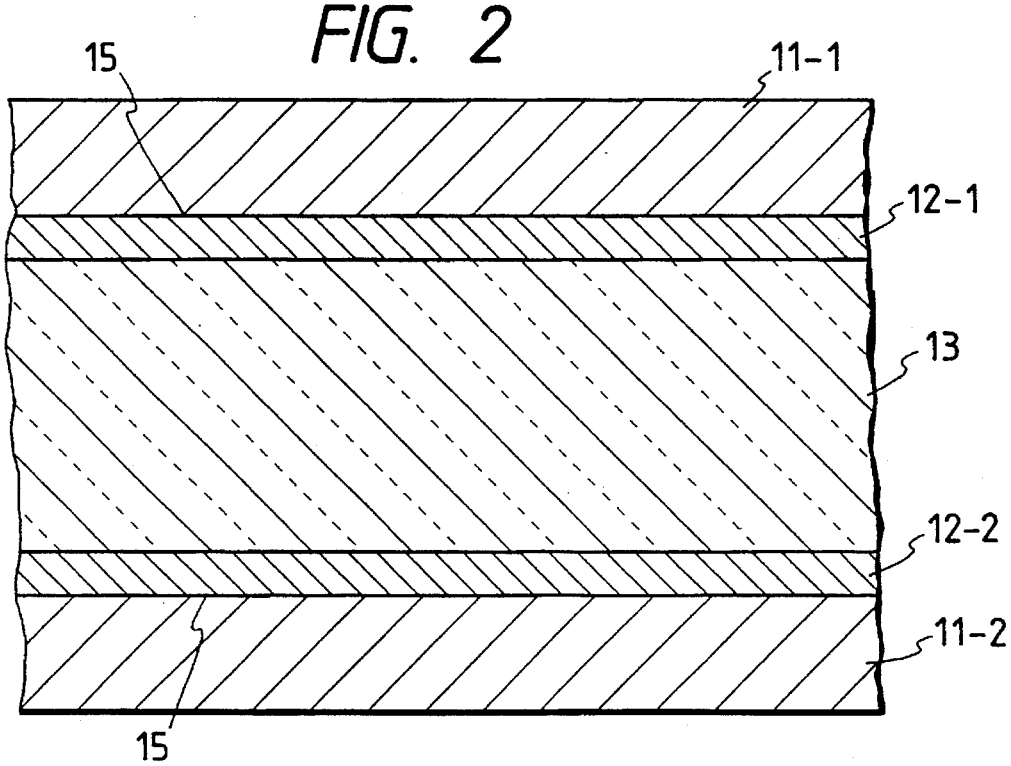

COPPER CLAD LAMINATE, MULTILAYER PRINTED CIRCUIT BOARD AND THEIR PROCESSING METHOD

BACKGROUND OF THE INVENTION

The present invention relates to the copper clad laminate for the film or the substrate that is used for the printed circuit, the multilayer printed circuit board, and their processing method. As described on P.299 to 564 of Purinto Kairo Gijutsu Binran (Printed Circuit Handbook, the 2nd version published by Nikkan Kogyo Shinbun Co. Ltd.), the copper clad laminates include; (1) the laminate made of copper foil and paper based phenolic resin, paper based epoxy resin, paper based polyester resin, glass cloth based epoxy resin, glass cloth based polyimide resin, glass cloth based bismaleimide-triazine resin or glass cloth based fluoroplastics, (2) the laminate made of copper foil and the aramid cloth impregnated with epoxy resin or low dielectric constant resin, and (3) composite copper clad laminate consisting of the glass cloth based epoxy resin layer, and paper or non-woven glass cloth based epoxy resin as core material. Said laminates are rigid copper clad laminates; in addition, there is available another type of copper clad laminate for flexible printed circuit board made of normally one sheet of thin flexible plastic film and the copper foil using the adhesive. Polyester film and polyimide film are used as the plastic film.

The copper foil can be classified into two types; the electrodeposited copper foil and the rolled copper foil. Furthermore, they can be classified into many types according to the classification method; e.g., classification of the copper foil corresponding to the resin to be used or classification according to the copper foil thickness and mechanical properties.

Adhesive coated cooper foil has been used for the phenolic resin copper clad laminate and the copper clad laminated for the flexible printed circuit board, hitherto. Furthermore, in the case of the epoxy resin copper clad laminate and the polyimide resin copper clad laminate, the resin material has been used as insulation layer to adhere the copper foil directly. In recent years, the conductor spacing of the printed circuit board has been considerably reduced due to the increased density and reduced weight and size of the electronic equipment. This trend has led to the requirements as inhibition of blisters when immersed in the molten solder bath, elimination of any problem in drilling operation and resistance to plating chemicals when plating is required. Such extremely severe properties, with smaller circuit configuration, have come to be required. These requirements, in turn, strongly require adhesion strength between the copper foil and such insulation layer such as synthetic resin substrate. In order to ensure adhesive strength, the copper foil adhesion surface is normally provided with fine particles (called roughing) on the convex part of the concave and convex structure of the electrodeposited copper foil called raw foil or base foil to ensure anchor effect of improving adhesive strength from the microscopic viewpoint in the case of electrodeposited copper foil; furthermore, it is provided with barrier forming and rust preventive treatment. This roughing treatment ensures adhesion strength between the copper foil surface and insulations layer to be maintained on the level of practical use. However, on the other hand, firstly in the circuit forming process, the concave and convex structure formed on the copper foil surface is not etched within a predetermined etching time to remain as residual copper on the substrate surface so that it becomes the cause of deteriorating the electric properties, and it requires a considerable etching time for removing this residual copper. This has caused the degree of side etching to be increased, making it difficult to form a fine circuit. For this purpose, low profiling is required in recent years, and the limit has been reached by trade off with adhesion strength. Secondly, since the concave and convex structure of the copper foil causes the high frequency waveform to be disturbed, further low profiling has been required.

Conventionally, epoxy resin and butyral-phenol resin based adhesives have been used as adhesives for copper foil and synthetic resin substrate (insulation substrate). Adhesion with copper foil is based on the hydrogen bonding and the anchor effect which uses the fine particles formed on the copper foil surface, and this was not direct chemical bonding; therefore, sufficient adhesion strength could be ensured only when shiny side (smooth surface) of the copper foil was provided with roughing treatment including black treatment.

As described above, in the laminates comprising the copper foil and insulation layer according to the prior art, adhesion strength has been increased by the anchor effect which is provided by fine particles attached on the protrusion of the base foil (raw foil) of the copper foil. As result, (1) in etching for circuit forming process, much time was required to remove the protrusion and fine particles embedded in the insulation layer (e.g. synthetic resin substrate), and side etching occurred to the copper foil; so reduction in the fine wiring width was limited, and the limit of fine wiring forming for copper foil has been considered to the limit the width of 0.1 mm in the industrial area. (2) Roughing by providing fine particles has led to increased number of processes and decreased yield; thus, it has been difficult to reduce copper foil production costs. (3) Roughing conditions has been difficult to control, making it difficult to ensure uniform product quality. (4) Furthermore, in order to ensure powerful adhesion between prepreg and copper foil, black treatment has been necessary to maintain adhesion strength between the copper foil shiny side in the formation of multiple layers of the multilayer circuit board.

On the other hand, adhesion between the rubber material and metal or between the rubber material and laminate is disclosed in the U.S. Pat. No. 4,446,198, Japanese Patent Laid-open NO. 51-57783, Japanese Patent Publication NO. 60-14836, Japanese Patent Publication NO. 56-19820, Japanese Patent Laid-open NO. 54-53180 and Japanese Patent Laid-open NO. 1-201454. There is no instance, however, where the metal layer is to provided on the copper foil, and adhesion through cross linking between the copper foil and insulation layer is provided by chemical bonding through sulfur atom. Furthermore, Japanese Patent Laid-open NO. 3-111464 describes the case of using the acrylonitrile rubber containing zinc oxide as adhesive between the laminate and copper foil, but does not refer to metal layer provided on the copper foil and adhesion through cross linking by chemical bonding through sulfur atom.

SUMMARY OF THE INVENTION

An object of the present invention is to solve the problems of the said prior art and to provide the copper clad laminate featuring excellent high frequency signal transmission property, the laminate having the adhesive section is characterized by powerful adhesion between the copper foil and copper foil or between copper foil and insulation layer, without the need of roughing or black treatment of forming the protrusion or providing fine particles to the protrusion.

Another object of the present invention is to provide a multilayered printed circuit board which has the adhesive section of powerful adhesion between the copper foil for the circuit and the insulation layer and which has an excellent high frequency signal transmission property.

A further object of the present invention is to provide the treatment method for further improvement of the adhesiveness between the copper clad laminate copper foil and insulation layer, or between the multilayered printed circuit board circuit copper foil and insulation layer.

The present inventors have made strenuous research efforts to solve said problems. As a result, they have found out that the copper foil and the insulation layer can be powerfully connected-by adhesion of the copper foil and the insulation layer through cross linking through chemical bonding using the specific metal layer and specific adhesive provided on the copper foil. This finding has led to the completion of the present invention. Solution of the problems of said prior art has become possible by appearance of the adhesive which ensures powerful adhesion strength, without the need of roughing the copper foil adhesive surface.

Namely, the present invention intended is to provide the copper clad laminate characterized in that, in the copper clad laminate having the adhesive section wherein copper foil and insulation layer are laminated and adhered, the foil has the metal layer on the adhesive surface between copper foil and insulation layer, and the metal layer and insulation layer are cross-linked by chemical bonding through sulfur atom. The number of sulfur atoms in the said chemical bonding is one or more, and the sulfur source of the sulfur atom is the vulcanizing agent such as vulcanizing agent, sulfur donor and thiols.

If the copper clad laminate in the present invention has the adhesive section wherein the copper foil having the metal layer on the adhesive surface and the insulation layer as adhesive layer are laminated and adhered, it is not restricted by any particular layer composition. It is possible that the insulation layer is cross-linked to the copper foil whose adhesive surface has the metal layer and, furthermore, the metal substrate is laminated and adhered to the insulation layer adhered to the copper foil through cross-linking. It is also possible that the insulation layer is composed of the cross-linked adhesive layer serving as synthetic resin substrate; that is, it may be the insulation layer serving as synthetic resin substrate by cross-linking the adhesive impregnated substrate comprising the substrate impregnated with the adherent containing the chemicals having vulcanizable unsaturated bonding and at least one type of vulcanizing agent selected from sulfur, sulfur donor and thiols. It should be noted that, when there is only copper foil without metal layer, CuS is formed on the copper foil surface, resulting in remarkable reduction in adhesion strength.

The cyanoester resins, epoxy resin and polyimide film contain the vulcanizable unsaturated bond, or can be made to contain unsaturated bond in many ways. These basic molecular structure can be made to contain vulcanizable unsaturated bonding. It is also possible to contain unsaturated bonding to be included by mixing them with other vulcanizable polymers which mix well with these resins. These resins are effectively used as adhesive component for said substrate impregnation.

Furthermore, it is possible to form the adhesive coated film on the copper foil having the metal layer on the surface, and to form the copper foil and substrate by lamination by allowing the vulcanizable unsaturated bonding to be contained in the insulation base side for the substrate, thereby forming the copper clad laminate where the copper foil and the insulation substrate are adhered through cross linking. Moreover, it is also possible to apply the cross-linking adhesive to the prepreg which will serve as the insulation substrate and to form this prepreg and the copper foil having metal layer on the surface by lamination, thereby forming the copper clad laminate where the copper foil and the insulation substrate are adhered by cross linking.

The insulation substrate of the present invention is not restricted to the one used in the copper clad laminate for the normal printed circuit or to any other new ones. Those made of rigid synthetic resin substrates or flexible film bases can also be used. The conductive circuit may be formed on or inside the insulation substrate. This conductive circuit may be formed of the copper foil provided with the metal layer used in the present invention, or may be formed of the copper clad laminate according to the prior art.

Furthermore, the copper clad laminate according to the present invention may have the conventional adhesive section in addition to that of the present invention. Also, the laminate may be provided such resistance layer as stainless steel foil, aluminum foil and nickel foil. In that case, the resistance layer may be adhered to the insulation layer by lamination using the adhesive used in the present invention.

If the adhesive used in the present invention is used to obtain the copper clad laminate having the adhesive section where copper foil and insulation substrate are adhered by lamination through the metal layer, the adhesive is adhered to the metal layer of the copper foil through cross linking to form powerful chemical bond, thereby providing excellent adhesion strength. In the said metal substrate, besides the copper foil, the adhesive used in the present invention exhibits powerful adhesion strength based on direct chemical bonding, when provided with said surface-treated metal layer.

Lamination adhesion conditions are normally selected from, but not limited to, the ranges from 100 to 250 degrees Celsius, from 5 to 300 kg/cm$^2$, and from 5 to 90 minutes. Selection is made of the conditions where direct vulcanization between said adhesive and copper foil or surface-treated metal layer of the metal substrate, and vulcanization of the said adherent itself occur at the same time (these conditions can be selected by easy experiment), thereby realizing powerful adhesion based on mutual chemical bond. This adhesion strength is so powerful that adhesive will be subjected to cohesive failure. These conditions can be obtained by using simple experiment to find out the conditions which ensure powerful adhesion for combinations of the adherents and metal layers.

The present invention, in the multilayer printed circuit board having the multilayer circuit copper foils formed of the copper foil inside the insulation substrate, provides the multilayer printed circuit board characterized in that the metal layer and insulation layer are adhered through cross linking by chemical bonding through sulfur atom.

A concrete example of this multilayer printed circuit board includes the circuit copper foils of a pair of wiring boards which are adhered by cross linking through the chemicals having vulcanizable unsaturated bonding as the base, and the material impregnated with the adhesive containing at least one type of vulcanizing agent selected from sulfur, sulfur donor and thiols. The adhesion improvement mechanism for the circuit copper foil and the insulation layer in the multilayer printed circuit board is the same as that of the copper clad laminate.

Concrete examples of the insulation substrate include (1) those composed of paper based phenolic resin laminate, paper based epoxy resin laminate, paper based polyester resin laminate, glass cloth based epoxy resin laminate, glass cloth based polyimide laminate, glass cloth based fluoroplastics laminate, glass cloth based bismaleimide-triazine laminate and glass cloth based modified cyanoester resin, (2) those composed of aromatic polyamide resin fiber- or cloth-reinforced polyimide or the cyanoester resin and aramid resin cloth impregnated with epoxy resin or heat resistant resins such as low dielectric constant polyimide and fluoroplastic, and (3) those composed of composite laminate comprising the glass cloth based epoxy resin laminate on the surface and paper or non-woven fabric based epoxy resin as core material. The above products are so-called hard synthetic resin substrate. It is also possible use the film material based on thin polyester film or polyimide film.

In addition, it is also possible to use the silicon substrate, gallium based semiconductor wafer, glass substrate, ceramic substrate and the substrates which employ beryllia, graphite, boron nitride and paper.

Examples of the metal substrate include iron plates (silicon steel, stainless steel), aluminum substrate and titanium substrate.

The copper foil used in the present invention may be either the electrodeposited copper foil or the rolled copper foil. The thickness is not fixed; it is normally 3 to 500 µm, preferably 5 to 500 µm and more preferably 5 to 150 µm.

It should be noted that, when copper foil is below 3 µm thick, it is likely to be subjected to crease or breakage; its handling is not convenient. When it is over 500 µm, copper particles are likely to be produced on electrodeposited copper foil, and the copper foil surface (mat side) may be characterized by lack of uniformity in the roughness.

The metal layer comprising the metal or metal alloy containing at least one element selected from B, Al, P, Cu, Zn, Ti, V, Cr, Mn, Fe, Co, Ni, Ag, In, Zr, Sn, Nb, Mo, Ru, Rh, Pd, Pb, Ta, W, Ir and Pt is preferably used as the metal layer provided on the adhesion surface of the copper foil; it is provided on the adhesion side of the copper foil as metal or metal alloy. Examples of this alloy metal are Cu—Zn alloy, Ni—Zn alloy, Ni—Sn alloy, Ni—Cu alloy, Pd—P alloy and Ni—P alloy. As for the composition range to ensure powerful adhesion strength, the ratio of Cu with respect to other elements is 1 to 90 weight percent, more preferably 5 to 70 weight percent. The ratio of Ni with respect to other elements (for example, Zn, Sn, Cu and P) is 1 to 90 weight percent, more preferably 5 to 70 weight percent. Furthermore, non-magnetic metal is indispensable to high frequency use; for example, Pd, and alloy between Pd and said elements other than Pd (e.g. alloy with P). The ratio of Pd with respect to other elements is 1 to 99 weight percent, more preferably 60 to 95 weight percent. It should be noted that Cu is not used as an independent metal layer; it is used only as an alloy element. To give an example of the composite metal layer, Pd—P alloy is used as is used as ground barrier forming metal layer, and the metal layer comprising Cu—Zn alloy is used as surface metal layer.

Means of forming these metal layers includes electroplating, vapor deposition plating and sputtering plating. Normally, use of the electroplating is preferred from the viewpoint of productivity. To give an example of metal layer forming method, palladium is reduced from formalin solution of palladium chloride by chemical plating, or it is immersed in the colloid catalyst of palladium chloride and tin ion, thereby forming the metal layer.

The metal layer thickness is normally 5 µm or less, preferably 0.01 to 5 µm, and more preferably 0.01 to 1 µm, but is not restricted to such values.

Even if the metal layer thickness exceeds 5 µm, adhesion strength is saturated without being increased any further. Furthermore, according to the current manufacturing technique, it is difficult to manufacture the metal layer having a uniform thickness when the metal layer thickness is below 0.01 µm. Pin holes may occur and the underground copper foil may be exposed, resulting in reduced adhesion strength.

The copper foil surface on the adhesion surface side may be either roughened or smooth. Even for the copper foil having a smooth surface—the copper foil where anchor effect cannot be expected—the copper clad laminate according to the present invention ensures powerful adhesion strength, eliminating the need of the copper foil roughing process. It allows use of the copper foil having a smooth surface suited to high frequency application.

When the electrodeposited copper foil is manufactured, for example, there is a process of forming the rolled base foil or so called raw foil process, where copper foil is electrodeposited on a continuous basis with the rotary drum as a cathode in the copper sulfate aqueous solution, and copper foil is separated on a continuous basis. In this case, the surface separated from the drum is called shiny side (S) or drum side; it has a relatively smooth surface. The other surface is called mat side (M) having convex forms. Fine particles are provided on this convex form in the next roughing treatment process, resulting in surfaces provided with roughing treatment. In still further process, the M side of the copper foil is provided with electrochemical rust preventive treatment which is called surface treatment or post-treatment. The adhesive used in the present invention ensures powerful adhesion between the copper foil and the copper foil or the copper foil and the insulation layer, without such roughing treatment.

When the copper foil surface roughness is expressed in terms of central line mean roughness Ra specified in the JIS (Japanese Industrial Standard)-B-0601, the side S is normally 0.1 to 0.35 µm in the case of electrodeposited copper foil, while the side M, which is not provided with roughing treatment, is about 0.1 to 2.0 µm. On the other hand, the surface roughness of the rolled copper foil is 0.1 to 0.15 µm on both sides. The copper clad laminate according to the present invention has the advantage of ensuring sufficient adhesion strength, independently of use of the copper foil having any of such surface roughnesses, thereby expanding the scope of copper foils to be selected. When the copper clad laminate is used for high frequency waveform signals, copper foil is required to have the surface roughness Ra of 0.35 µm or less, preferably 0.2 µm or less from the viewpoint of surface effect. In this case, sufficient adhesion strength is ensured.

The adhesive containing the chemicals having vulcanizable unsaturated bond and at least one type of vulcanizing agent selected from sulfur, sulfur donor and thiols is used as the adhesive for adhesion through cross linking in the present invention.

Said adhesive layer thickness should preferably be 5 to 1000 µm. When the adhesive layer thickness is below 5 µm, reduction in adhesion strength and insulation properties may be observed. Even if the adhesive layer thickness is over 1000 µm, adhesion strength does not increase any further, so this is not economical. More preferred range of the adhesive layer thickness is 10 to 500 µm.

Monomer, oligomer, polymer or elastomer having vulcanizable unsaturated bonding are used as the chemicals having vulcanizable unsaturated bonding.

Examples of oligomer, polymer or elastomer include styrene butadiene rubber (SBR), butadiene rubber (BR) and nitrile butadiene rubber (NBR) having unsaturated bonding based on butadiene; natural rubber (NR), isoprene rubber (IR), chloroprene rubber (CR), butyl rubber (IIR) and halogenated butyl rubber having unsaturated bonding based on isoprene; ethylene-α-olefin copolymer elastomer having unsaturated bonding based on dicyclopentadiene (DCPD), ethylidene norbornene (ENB) and 1,4-dihexadiene (1,4-HD), namely, ethylene-α-olefin copolymer obtained by copolymerization of α-olefin and dienes, such as ethylene propylene diene terpolymer (EPDM) and ethylene butene diene terpolymer (EBDM). Especially, the EBDM is more preferable. Examples also include hydrogenated nitrile rubber, fluorocarbon rubbers such as vinylidenefluoride-hexafluoropropene copolymer and vinylidenefluoride-pentafluoropropene copolymer, epichlorohydrine homopolymer (CO), copolymer rubber (ECO) prepared from epichlorohydrine and ethylene oxide, epichlorohydrine allyl glycidyl copolymer, propylene oxide allyl glycidyl ether copolymer, propylene oxide epichlorohydrine allyl glycidyl ether terpolymer, acrylic rubber (ACM), urethane rubber (U), silicone rubber (Q), chlorosulfonated polyethylene rubber (CSM), polysulfide rubber (T) and ethylene acrylic rubber. Further examples include various liquid rubbers, e.g. various types of liquid butadiene rubbers, and the liquid atactic butadiene rubber which is butadiene polymer with 1,2-vinyl connection prepared by anionic living polymerization. It is also possible to use liquid styrene butadiene rubber, liquid nitrile butadiene rubber (CTBN, VTBN, ATBN, etc. by Ube Industries, Ltd.), liquid chloroprene rubber, liquid polyisoprene, dicyclopentadiene type hydrocarbon polymer and polynorbornene (by Elfatochem).

Examples also include the unsaturated polyester resin based on maleic anhydride, fumalic acid, itaconic acid and citraconic acid, unsaturated epoxy acrylate resin based on acryloyl group, methacryloyl group and allyl group, urethane acrylate resin, polyether acrylate resin, polyalcohol acrylate resin, alkyd acrylate resin, polyester acrylate resin, spiroacetal acrylate resin, diallyl phthalate resin, diallyl tetrabromophthalate resin, diethleneglycole bisallylcarbonate resin, and polyethlene polythiol resin.

The monomer includes, for example, such maleimides as N,N'-m-phenylenebisamide, triallylisocyanulate and trimethallylisocyanulate.

Of these compounds, the following compounds are effectively used for the cost and properties such as heat resistance; ethylene α-olefin copolymer such as ethylene propylene diene terpolymer (EPDM) and ethylene butene diene terpolymer (EBDM), nitrile butadiene rubber (NBR), hydrogenated nitrile rubber, chloroprene rubber (CR), styrene butadiene rubber (SBR), butyl rubber (IIR) and halogenated butyl rubber.

The NBR having an acrylonitrile content of 15 to 55 weight percent is effectively used. The rubber effectively used has Mooney viscosity specified in JIS-K-6300 ranging from 20 to 100 at $ML_{1+4}$ (100° C.). This rubber is normally vulcanized at the temperature from 140 to 180 degrees Celsius for 5 to 50 minutes.

The SBR effectively used has a styrene content of 5 to 85 weight percent and a Mooney viscosity of 30 to 80 at $ML_{1+4}$ (100° C.).

The EPDM effectively used has Mooney viscosity specified in JIS-K-6300 ranging from 5 to 110, and has an ethylene content of 45 to 85 weight percent and a diene content of 2.0 to 25 weight percent, without being restricted to these figures. The diene is composed of dicyclopentadiene (DCPD), 1,4-hexadiene or ethylidene norbornene (ENB), without being restricted to these compounds. Preferable diene components include DCPD and ENB.

The effectively used EBDM has Mooney viscosity ($ML_{1+4}$ (100° C.)) of 1 to 50, melt flaw rate (190° C.) of 1.5 to 25, an ethylene content of 55 to 95 weight percent and a diene content of 2 to 35 weight percent, without being restricted to these figures. Similar to the case of the EPDM, diene components include dicyclopentadiene (DCPD), 1,4-hexadiene (1,4-HD) or ethylidene norbornene (ENB), without being restricted to them.

The EPDM and EBDM having both wide and narrow molecular weight distribution can be used.

Both the EPDM and EBDM have excellent electric properties; they are superior particularly in corona resistance and tracking resistance required by the printed circuit in recent years; they are by far superior to the conventional adherents. The properties of ethylene propylene diene terpolymer are affected by the molecular structure, molecular weight (Mooney viscosity), the type and content of the third component, ratio between ethylene and propylene, and their branching.

When using ultra-high molecular weight polymer of the EPDM and EBDM, Mooney viscosity can be adjusted by applying stretch oil, thereby improving workability.

Ethylene propylene copolymer (EPM) and ethylene buten copolymer (EBM) have no vulcanizable unsaturated bonding, but this defect can be made up by the use of monomer, oligomer or polymer having adequate unsaturated bonding. The present invention allows use of the component of such polymer mixed with compounds having unsaturated bonding.

This means that the oligomer, polymer or elastomer mainly used in the present invention, including the EPM and EBM as well as EPDM and EBDM, can be mixed with diene type elastomer, polymer, oligomer or monomer in order to improve the adhesion properties between metal layer and adherent, resulting in remarkable improvement in adhesion. The mixing ratio of diene type elastomer, polymer, oligomer or monomer is preferably 5 to 50 parts by weight with respect to 100 parts by weight of compounds having vulcanizable unsaturated bonding.

Said diene type elastomer polymer or oligomer includes butadiene acrylonitric copolymer, natural rubber, polybutadiene, polyisoprene, butyl rubber, halogenated butyl rubber, styrene butadiene copolymer and polychloroprene.

Styrene butadiene copolymer (SBR) is basically a copolymer comprising butadiene and styrene bonded at random. This SBR can also be used as diene polymer or oligomer. Except for butadiene and styrene, the terpolymer such as methacrylic acid and divinylbenzene containing a small amount of third components, and the mixed polymer of SBR and high styrene resin can also be used. Depending on the polymerization method, the SBR is broadly classified into emulsion polymerized SBR and solution polymerized SBR. Furthermore, depending on the form of the product, it is classified into solid SBR and latex SBR. All of them can be used. Generally, the SBR does not include the block polymer of butadiene and styrene, which can be used in the present invention.

Polybutadiene is available as general-purpose polybutadiene and liquid polybutadiene; they are used according to the particular needs. Butadiene acrylonitrile copolymer can also be used. Liquid polybutadiene includes the NiSSO-PB where about 90 percent of the oligomer skeleton obtained by anionic living polymerization of butadiene is 1,2-vinyl connection type, its derivatives having the functional group such as vinyl group, carboxyl group and hydroxyl group or its hydrogenated substance, acrylic group terminated, maleic modified, epoxy modified and epoxy resin modified. There are also liquid polybutadiene (LPB) by Nippon Petrochemical Co., Ltd. which contains allyl end group and has a such molecular structure that 1,2-connection of about 65% in butadiene unit, trans-1,4 connection type of about 14% and cis-1,4 connection type of 16% are bonded at random, as well as its maleic modified, epoxy modified, phenol modified, half ester, acryl modified, imide modified and amine modified. It also includes "Poly bd" by Idemitsu Petrochemical Co., Ltd. which is liquid polybutadiene provided with highly reactive hydroxyl group at the molecular terminal where about 60% is trans-1,4 connection type, about 20% is cis-1,4 connection type and about 20% is vinyl-1,2 connection type, as well as its derivatives. It is also possible to use HYCAR RLP (trademark) by B. F. Goodrich Chemical Co. and Ube Industries, Ltd., which is the low molecular polymer largely composed of butadiene, having regular functional groups at both terminals of the main chain and containing the acrylonitrile group at the main chain, as well as those having carboxyl group, amine group and vinyl group at both molecular terminals.

Furthermore, liquid chloroprene rubber, liquid isoprene and liquid styrene butadiene copolymer can also be used. The majority of the general-purpose polybutadienes are produced by solution polymerization, and very few of them are made by emulsion polymerization; both of them can be used in the present invention. The products by solution polymerization includes Co derivatives, Ni derivatives and Ti derivatives of Ziegler catalyst, as well as Li derivatives pertaining to alkyllithium catalyst. In conformity to it, it can be divided into two types; one type wherein about 90% is cis-1,4 connection type and the other type where about 35% is cis-1,4 connection type. Both types can be used in the present invention. When the mixture with general-purpose polybutadiene is to be produced, mixing of adequate third components is allowed in order to improve the mixing properties of both types. The third components are selected from styrene butadiene copolymer, liquid rubber and what is normally called compatibilizer.

The compounds having said vulcanizable unsaturated bonding comprises at least one type of vulcanizer selected from sulfur, sulfur donor and thiols. The content of the vulcanizer should preferably be 0.1 to 30 parts by weight with respect to 100 parts by weight of said high molecular substance. It should be noted that the metal oxide vulcanizer, for example, zinc oxide, can also be used in combination.

Sulfur powder and insoluble sulfur are used as sulfur for vulcanization.

Sulfur donor for vulcanization uses the organic compound which is decomposed at the vulcanization temperature to release active sulfur atoms. Such compounds include a group of compounds which have S—S connection inside the molecule and which can be expressed by the following general equation:

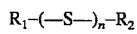

$$R_1-(-S-)_n-R_2$$

(where $R_1$ and $R_2$ are groups having an excellent disorption from sulfur atom, such as dialkylamino group, morpholino group and benzothiazolyl group, and "n" denotes an integer from 2 to 6.

These compounds include 2-(4'-morpholinodithio)benzothiazole (MDB), 5-chloro-(4'-morpholinodithio)benzothiazole, 5-nitro-(4'-morpholinodithio)benzothiazole, 6-chloro-(4'-morpholinodithio)benzothiazole, 6-nitro-(4'-morpholinodithio)benzothiazole, 7-chloro-(4'-morpholinodithio)benzothiazole, 7-nitro-(4'-morpholinodithio)benzothiazole, 8-chloro-(4'-morpholinodithio)benzothiazole, 8-nitro-(4'-morpholinodithio)benzothiazole, 2-nitro-(3'-morpholinodithio)benzothiazole, tetramethylthiuram disulfide, tetrapropylthiuramdisulfide, tetrabutylthiuram disulfide, tetrakis(2-ethylhexyl)thiuramdisulfide, dipentamethylenethiuramtetrasulfide, tetrakis(3-chloropropyl)thiuramdisulfide, tetrakis(3-nitropropyl)thiuramdisulfide, tetrakis (3-hydroxypropyl)thiuramdisulfide, dipentamethylenethiuramtetrasulfide (TRA) and 4,4-dithiomorpholine (R).

In addition, tetramethylthiuramsulfide (TS) can also be used though not incorporated in the above general equation.

Various types of polythiols which are thermally stable are used as thiols for vulcanization. These polythiols include 2,4,6-trimercapto-1,3,5-triazine and metal salts thereof, 2,4-dimercapto-1,3,5 -triazine derivatives having such a substituent as aminoalkyl at the 6th position, and metal salts thereof, and ester between thioglycolic acid and polyalcohol. The metal salt is normally monosodium salt and monopotassium salt. The 2,4-dimercapto-1,3,5 -triazine derivatives having aminoalkyl at the 6th position can be easily obtained by causing the 2,4-dichloro-6-alkylamino-1,3,5-triazine to react with sodium hydroxide; the 2,4-dichloro-6-alkylamino-1,3,5-triazine being obtainable by reaction of cyanuric chloride and various kinds of amino compounds at a low temperature. In this case, use of the polybasic amino compound such as ethylene diamine will produce the compound including the multiple 1,3,5-triazine ring cross-linked by the amino compound used. Such compounds include 2,4-dimercapto-6-methyl amino-1,3,5-triazine, 2,4-dimercapto-6-ethylamino-1,3,5-triazine, 2,4-dimercapto-6-propylamino-1,3,5 -triazine, 2,4-dimercapto-6-isopropylamino-1,3,5-triazine, 2,4-dimercapto-6-butylamino-1,3,5-triazine, 2,4-dimercapto-6-isobutylamino-1,3,5-triazine, 2,4-dimercapto-6-dimethylamino-1,3,5-triazine, 2,4-dimercapto-6-diethylamino-1,3,5-triazine, 2,4-dimercapto-6-dipropylamino-1,3,5-triazine, 2,4-dimercapto-6-diisopropylamino-1,3,5-triazine, 2,4-dimercapto-6-dibutylamino-1,3,5-triazine, 2,4-dimercapto-6-allylamino-1,3,5-triazine, 2,4-dimercapto-6-phenylamino-1,3,5-triazine, 2,4-dimercapto-6-tolylamino-1,3,5-triazine, N,N'-bis(2,4-dimercapto-1,3,5-triazinile)ethylenediamine, 2,4-dimercapto-6-hydroxyethylamino-1,3,5-triazine, and 2,4-dimercapto-6-bis(hydroxyethyl)amino-1,3,5-triazine. In addition, 2,4-dimercapto-6-acrylamino-1,3,5-triazine and the like are effectively used. Furthermore, the high molecular type includes the polymer with 2,4-dimethylcapto-6-dibutylamino-1,3,5-triazine residue bonded to the amino group of the polyallylamine resin having the primary amino group on the side chain. The ester of thioglycol acid and polyalcohol includes the glycerin trithioglycolate, trimethylolpropane trithioglycolate and pentaerythritol tetrathioglycolate.

It is also possible to use such peroxides as dicumyl peroxide, α,α'-bis(t-butyl peroxyisopropyl)benzene and 2.5-dimethyl-2,5-di(t-butyl peroxy)hexane, together with the vulcanizing agent, the type of said peroxides not being restricted only to said compounds. The mixing ratio of the peroxide should preferably be 0.01 to 10 parts by weight with respect to 100 parts by weight of the compound having said unsaturated bonding. Especially, a more preferable result can be obtained by using the thiols for vulcanization together with the peroxides mentioned above.

Furthermore, vulcanization accelerator, together with vulcanizing agent, should preferably be contained in the adherent whenever required. The vulcanization accelerator includes organic acid salt such as cobalt naphthenate; calcined magnesia, zinc oxide, and litharge; aldehyde ammonia derivatives such as hexamethylene tetramine; aldehyde amine derivatives such as n-butylaldehydeaniline; thiourea derivatives such as N,N'-diphenylthiourea, trimethylthiourea and N,N'-diethylthiourea; guanidine derivatives such as 1,3-dipenylguanidine, di-o-tolylguanidine, 1-o-tolylbiguanidine derivatives and di-o-tolylguanidine salt of dicathecole borate; thiazole derivatives such as 2-mercaptobenzothiazole, dibenzothiazyldisulfide, zinc salt of 2-mercaptobenzothiazole, cyclohexylamine salt of 2-mercaptobenzothiazole, 2-(N,N'-diethylthiocarbamoylthi)benzothiazole, and 2-(4'morfolinodithio)benzothiazole; sulfonamide derivatives such as N-cyclohexyl-2-benzothiazolylsulfenamide, N-t-butyl- 2-benzothiazolylsulfenamide, N-oxydiethylene-2-benzothiazolylsulfenamide and N,N'-dicyclohexyl-2-benzothiazolylsulfenamide; thiuram derivatives such as tetramethylthiuramdisulfide, tetraethylthiuramdisulfide, tetrabutylthiuramdisulfide, tetrakis(2-ethylhexyl)thiuramdisulfide, tetramethylthiurammonosulfide and dipentamethylenethiuramtetrasulfide; metal salts of diethyldithiocarbamic acid such as piperidine pentamethylenedithiocarbamate, pipecolin pipecolyldithiocarbamate, zinc dimethyldithiocarbamate, zinc diethyldithiocarbamate, zinc N-ethyl-N-phenyldithiocarbamate, zinc N-pentamethylenedithiocarbamate, zinc dibenzyldithiocarbamate, zinc dibutyldithiocarbamate, sodium diethyldithiocarbamate, sodium dibutyldithiocarbamate, copper dimethyldithiocarbamate, ferric dimethyldithiocarbamate and tellurium diethyldithiocarbamate; metal salts of xanthate homologues such as zinc butylxanthate, and zinc isopropylxanthate; and their combinations, without being restricted to them. The vulcanization accelerator content should preferably be 0.01 to 10 parts by weight with respect to 100 parts by weight of said adherent.

It should be noted that these vulcanizing agents or vulcanization accelerators are effective in improving the adhesion strength when they are coated on the copper foil metal layer, if not impregnated in the adherent.

Furthermore, it is possible, whenever required, to add the anti aging agent such as amine ketone derivatives, aromatic secondary amine derivatives, phenol derivatives, polyphenol derivatives, benzimidazole derivatives, metal dithiocarbamate derivatives, thiourea derivatives, phosphorous acid derivatives, organic thioacid derivatives and wax derivatives. The content of the anti aging agent should preferably be 0.01 to 5.0 parts by weight with respect to 100 parts by weight of said adherent.

The adherent used in the present invention can be mixed with the compatibilizer and modifier comprising the high molecular substances other than those used in the adherent in order to improve compatibilization with the synthetic resin substrate and property modification.

For example, the following are used; phenol resins such as resol type, novolak type, alkylphenol type xylene resin modified and melamine modified; sulfur p-t-butylphenol resin (Sanfel BTS, Sanshin Chemnical Inc.); various epoxy resins such as bisphenol A type, bisphenol F type, novolak type, brominated bisphenol A type, brominated novolak type and alicyclic type; ester cyanate type, cumarone indene copolymer, hydrogenated rosin, rosin ester, rosin modified maleic resin, and such rosins as well as their derivatives; petroleum resin, melamine resin, polyester resin, acryl resin, silicone resin, high molecular monomer having polymerizable functional group; polyether rubber such as graft copolymer between said high molecular monomer and low molecular monomer and propylene oxide epichlorohydrine allyl glycidyl ether terpolymer; propyrene oxide rubber, polysulfide rubber, fluorocarbon rubber, ethylene propylene tetrafluoride rubber, chlorosulfonated polyethylene rubber, ethylene acryl rubber, silicone rubber, urethane rubber, polyisoprene, polyisobutylene, blend elastomer forming the IPN (Interpenetrating Polymer Network), e.g. polystylene and polybutylene IPN, IPN between phenol resin or epoxy resin and liquid rubber and acryl rubber, cross linked silicone rubber, ethylene acryl rubber, epoxy resin IPN containing elastomer latex such as nitrile butadiene rubber, styrene butadiene runner and ethylene propylene rubber.

High molecular monomers having the polymerizable functional group at the terminal effectively used are those having the functional groups such as carboxyl group, methacryloyl group, dihydroxyalkyl group and epoxy group at the terminal of the high molecules such as polystyrene, styrene-acrylonitrile copolymer, polyacrylonitrile, polymethylmethacrylate, polybutylacrylate and silicone. The low molecular monomer which is graft-copolymerized with said high monomer used effectively includes the vinyl monomer such as ester acrylate, vinyl acetate, styrene, and vinylpyridine.

Furthermore, it is possible to add 1 weight percent or less at least one type of compounds and surfactants selected from various silane, titanium, aluminium based coupling agents.

The mixing ratio of the compatibilizer or modifier is normally 1 to 60 weight percent with respect to the entire adhesive, and should preferably be 5 to 50 weight percent; it is more preferably 5 to 30 weight percent. When the compatibilizer or modifier is added, adhesion strength with the copper foil and substrate will be increased by the function of the compatibilizer, resulting in powerful adhesion between copper foils (circuit copper foils) or between the copper foil and substrate.

The adhesive can be used in any of the following types; sheet type, aqueous solution type, emulsion type or solvent type. It is possible to add, without affecting the effect of the present invention, the following to the adherent whenever required; asbestos, alumina, attapulgite, kaolin clay, carbon black, graphite, silic acid fine powder, calcium silicate, diatomaceous earth, magnesium oxide, titanium oxide, iron oxide, magnesium hydroxide, aluminum hydroxide, slate powder, selenite, molten silica powder, boron nitride, calcium carbonate, magnesium carbonate, talc, feldspar, molybdenum dioxide, barite, vermiculite, whiting, mica, agalmatolite clay, gypsum, and similar inorganic filler, or such fillers as phenolic resin microballoon, polyimide microballoon, wood meal and organic fiber powder.

Furthermore, carbon fiber, metal fiber, whisker, boron fiber, glass fiber, ceramic fiber, polyester fiber, vinylon fiber and polyamide fiber, can be used in the adherent. They are used in the form of filament, filament yarn, chopped fiber, staple fiber, pulp, spanized yarn, cloth and non woven fabric.

It is possible to add the pigment. Furthermore, petroleum based paraffin oil, naphthene oil and aromatic oil can be added as softener. It is also possible to aluminum hydroxide, hydrated gypsum, zinc borate, alunite, red phosphorus, mixture between halogenated organic compound and antimony trioxide, and similar fire resistant materials can be added.

When the copper clad laminate according to the present invention is immersed in the aqueous solution containing hydrochloric acid or salts thereof, e.g. cupric chloride and iron chloride, adhesion strength between the copper foil and insulation layer is further improved. The concentration of hydrochloric acid is preferred at 0.1 to 10N, and immersion time should preferably be 0.1 to 10 minutes.

BRIEF DESCRIPTION OF THE DRAWINGS

FIG. 1 is a sectional view representing the structure of the copper clad laminate in an embodiment of this invention; and FIG. 2 is a sectional view representing the structure of the copper clad laminate in another embodiment of this invention.

DESCRIPTION OF THE PREFERRED EMBODIMENTS

The following describes the preferred embodiments of the present invention; however, it should not be understood that the present invention is limited only to the following description.

[First Embodiment]

As illustrated in FIG. 1, a 0.2 mm thick rubber based adherent sheet 3 manufactured by calender roll as shown in the following (II) was held between each of nine types of copper foils provided with surface treated metal layer 2 (0.4 μm thick) shown in the following (I) and seven sheets of coated paper 4 (4-1, 4-2, . . . 4-7) for FR-1 grade paper based phenolic resin copper clad laminate (MCL437F) by Hitachi Chemical Co., Ltd., on the mat side 5 of of the 35 μm thick electrodeposited copper foil 1 not provided with roughing treatment (surface roughness: Ra 1.5 μm), and was laminated to be made in one integral piece at the temperature of 170° C. and the pressure of 200 kg/cm for one hour, thereby obtaining the copper clad laminate as shown in FIG. 1. The product has exhibited excellent value of 2.0 to 2.2 kg/cm in the 90-degree peel strength test conducted according to the JIS-C 6481, showing the cohesive destruction of rubber. Furthermore, 260° C. soldering heat resistance was shown to be 15 seconds or more, and the product sufficiently satisfied the specified standards.

Said coated paper was 0.25 mm thick before being laminated to be one integral piece, and was 1.75 to 2 mm when seven sheets of such paper were laminated. After being laminated to be one integral piece, however, the thickness was about 1.4 mm.

(I) Type of surface treated metal layers for the smooth side of the copper foil

| | | |
|---|---|---|
| <1> | Pd—P (weight ratio 100:6) | |
| <2> | Ni | |
| <3> | Co | |
| <4> | Zn | |
| <5> | Sn | |
| <6> | Ni—Cu (weight ratio 50:50) | |
| <7> | Zn—Cu (weight ratio 50:50) | |
| <8> | Zn—Cu (weight ratio 30:70) | |
| <9> | In | |

(II) Composition of rubber based adherent sheet

SBR (by Japan Synthetic Rubber Co., Ltd., Tradename: JRS152)—100 parts by weight Solid phenol resin (by Hitachi Chemical Co., Ltd., Tradename: HP180R)—20 parts by weight White carbon (PPG Industries Co., Ltd., Tradename: HiSil233T)—50 parts by weight Zinc oxide—5 parts by weight Stearic acid—1 part by weight Sulfur—1 part by weight

[Second Embodiment]

The copper clad laminate gained in said first embodiment is a one-sided copper clad laminate of a rigid type, whereas the present embodiment relates to the flexible both-sided copper clad laminate. It should be noted that embodiments 1 an 5 relates to a one-sided copper clad laminate of a rigid type, whereas the present embodiment (embodiment 2) and embodiments (3 and 4) relate to the flexible both-sided copper clad laminate rigid type As illustrated in FIG. 2, nine types of surface treated metal layers 12-1 and 12-2 were formed to a thickness of 0.5 μm by electroplating on the mat side 15 of the 18 μm thick electrodeposited copper foils 11-1 and 11-2 not provided with roughing treatment.

An SBR rubber based adherent sheet 13 shown in the following II was produced to a thickness of 0.2 mm. The mats of each of the said copper foils were set face to face, and said NBR rubber based adherent sheet 13 was held between them. The metal, rubber and rubber were vulcanized at the same time at the temperature of 170° C. and the pressure of 50 kg/cm² for 30 minutes and were laminated to be made in one integral piece, thereby obtaining the copper clad laminate as shown in FIG. 2 with the metal layers and adherent sheets alternating with each other. This laminate is a copper clad laminate for printed circuit having a core material of rubber.

(II) Composition of rubber based adherent sheet

SBR (by Japan Synthetic Rubber Co., Ltd., Tradename: JRS1502)—100 parts by weight

[Bonded styrene 23.5 percent by weight, Mooney viscosity $ML_{1+4}$ (100° C.) 52]

White carbon (PPG Industries Co., Ltd., Tradename: HiSil233T)—50 parts by weight Zinc oxide—5 parts by weight Stearic acid—1 part by weight Sulfur—2 parts by weight Dibenzothiazyldisulfide—1.5 parts by weight Said laminate was used to conduct the 90-degree peel strength test and 260° C. soldering heat resistance test according to the JIS-C 6481. It showed the cohesive destruction of rubber. The peel strength was 2.0 to 2.2 kg/cm, and powerful adhesion strength was demonstrated even on the copper foil side not provided with roughing treatment. The soldering heat resistance was shown to be 15 seconds or more.

When the conventional butyral based adhesive was used instead of the said rubber based adherent sheet, the peel strength was as low as 0.6 kg/cm, and the soldering heat resistance was 2 seconds or less, exhibiting a big difference.

To form the circuit having a width of 0.15 mm, the copper clad laminate was etched with cupric chloride etching solution for 30 seconds. Almost no side etching was observed on the laminate, which showed that excellent circuit was formed.

[Third Embodiment]

The shiny side (surface roughness: Ra 0.2 μm) of the raw 35 μm thick electrodeposited copper foil was provided with <1> the surface treated metal layer (0.5 μm thick) comprising Pd—P (weight ratio 100:6) by electroless plating, and with <2> the surface treated metal layer (0.5 μm thick) comprising Zn—Cu (weight ratio 30:70) by electroplating. The following 0.2 mm thick rubber based adherent sheet was held between two copper foils each, and was laminated to be made in one integral piece at the temperature of 170° C. and the pressure of 50 kg/cm² for 60 minutes, thereby obtaining the copper clad laminate.

(II) Composition of rubber based adherent sheet

NBR (by Japan Synthetic Rubber Co., Ltd., Tradename: T4632)—100 parts by weight

Solid phenolic resin (by Hitachi Chemical Co., Ltd., Tradename: HP180R)—30 parts by weight Epoxy resin (by Shell, Trademark EP828)—10 parts by weight Styrene/acrylonitrilemacromonomer (Macromonomer by Toha Gosei Co., Ltd., Tradename: AN-6)—5 parts by weight White carbon (PPG Industries Co., Ltd., Tradename: HiSil233T)—50 parts by weight Zinc oxide—5 parts by weight Stearic acid—1 part by weight Sulfur—1.5 parts by weight Said laminate was used to conduct the 90-degree peel strength test and 260° C. soldering heat resistance test according to the JIS-C 6481. It showed the cohesive destruction of rubber. The peel strength was 2.2 to 2.8 kg/cm, and powerful adhesion strength was demonstrated even on the copper foil side not provided with roughing treatment. The soldering heat resistance was shown to be 15 seconds or more.

[Fourth Embodiment]

Instead of the compatibilizer of the rubber based adherent sheet shown in Embodiment, the following 10 types of compatibilizers were added with respect to 100 parts by weight of NBR to produce ten types of rubber based adherent sheets:

1) Cumarone indene copolymer (by Nippon Steel Chemical Co., Ltd., Molecular weight: 300 to 400)—10 parts by weight 2) Polybutadiene (by Nippon Soda Co., Ltd., Tradename: Nisso PB-3000)—10 parts by weight 3) Polyisoprene (by Kuraray Co., Ltd., Tradename: Kuraprene LIR)—10 parts by weight 4) Dicyclopentadiene resin (by Nippon Petrochemical Co., Ltd., Tradename: Nisseki Neoresin EP-100)—5 parts by weight 5) Hydrated rosin (by Riken Hercules, Inc., Tradename: ForalAX)—5 parts by weight 6) Unsaturated polyester resin (maleic anhydride—isophthalic acid—propylene glycol based)—5 parts by weight 7) Silicone resin (Shin-Etsu Chemical Co., Ltd., Tradename: KE42)—5 parts by weight 8) $C_5$ based petroleum resin (by Nippon Zeon Co., Ltd. Tradename: Quinton A-100)—5 parts by weight 9) Silane coupling agent (γ-mercaptopropyltrimethoxy silane)—0.5 parts by weight 10) Epoxy modified polystyrenegraphite PMMA—5 parts by weight The laminate produced with the said rubber based adherent sheet in the same manner as Embodiment 3 was used to conduct the 90-degree peel strength test and 260° C. soldering heat resistance test according to the JIS-C 6481. It showed the cohesive destruction of rubber. The peel strength was 2.0 to 2.2 kg/cm, and powerful adhesion strength was demonstrated even on the copper foil side not provided with roughing treatment. The soldering heat resistance was shown to be 15 seconds or more.

[Fifth Embodiment]

A composition having a total of 163 parts by weight—100 parts by weight of NBR (HYCAR 1002) by B. F. Goodrich Chemical Inc. and 50 parts by weight of phenol modified resin (Durez 12687) by Sumitomo Durez Co., Ltd., 5 parts by weight of ZnO, 5 parts by weight of sulfur, 1.5 parts by weight of dibenzothiazyldisulfide (DM), and 1.5 parts by weight of stearic acid—was rolled into a 0.2 mm thick sheet. This was mounted on the smooth side (surface roughness: Ra 0.2 μm) of the 18 μm thick electrodeposited copper foil which was surface-treated (electroplated to a thickness of 0.5 μm) by the three types of metals—<1> Zn—Cu (weight ratio 30:70), <2> Ni—P (weight ratio 97:3) and <3> Pd—P (weight ratio 96:4). It was pressure-molded at the temperature of 160° C. for 30 minutes, together with the coated paper of the paper based phenol resin copper clad laminate used in Embodiment 1 and MCL E67 glass based epoxy resin coated paper by Hitachi Chemical Co., Ltd. The molding pressure was 150 kg/cm² for the former case, while it was 50 kg/cm² for the latter.

The 90-degree peel strength test was conducted according to the JIS-C 6481, and the result was 2 kg/cm or more at room temperature. Furthermore, the soldering heat resistance was 15 seconds or more at the temperature of 260° C., showing a satisfactory result.

[Sixth Embodiment]

A composition comprising 40 parts by weight of NBR (HYCAR 1002) by B. F. Goodrich Chemical Inc., 60 parts by weight of modified phenolic resin (Bakelite RD40-1) by Sumitomo Durez Co., Ltd., 10 parts by weight of ZnO, 1.75 parts by weight of sulfur, 0.625 parts by weight of dibenzothiazyldisulfide (DM), 1.5 parts by weight of stearic acid, 1 part by weight of cobalt naphthenate and 100 parts by weight of hard clay was rolled into a 0.2 mm thick sheet. This was mounted on the smooth sides (surface roughness: Ra 0.2 μm) of nine types of 18 μm thick electrodeposited copper foils which were surface-treated according to the Embodiment 1, and was laminated and adhered into an integral piece at the temperature of 160° C. and 150 kg/cm² for 45 minutes, together with the coated paper of the paper based phenolic resin copper clad laminate used in Embodiment 1.

The 90-degree peel strength test was conducted according to the JIS-C 6481, and the result was 2 kg/cm or more at room temperature. Furthermore, the soldering heat resistance was 15 seconds or more at the temperature of 260° C. showing a satisfactory result. After being immersed in hydrochloric acid, it was heated at the temperature of 180° C. for 48 hours; then the 90-degree peel strength test after soldering was conducted, and the result was satisfactory.

[Seventh Embodiment]

An about 0.2 mm thick adhesive sheet comprising 100 parts by weight of styrene butadiene rubber (JSR 1502) by Japan Synthetic Rubber Co., Ltd., 50 parts by weight of white carbon (PPG Industries Co., Ltd., Tradename: HiSil233T), 5 parts by weight of ZnO, 1 part by weight of sulfur, 1 part by weight of stearic acid, 1 part by weight of cobalt naphthenate and 1.5 parts by weight of vulcanization accelerator (2-mercptobenzothazole) was held between seven sheets of coated paper of the paper based phenolic resin copper clad laminate used in Embodiment 1, and the smooth side (surface roughness: Ra 0.2 μm) of the 18 μm thick electrodeposited copper foil provided with surface metal treatment to a thickness of 0.5 μm. They were laminated and adhered into an integral piece at the temperature of 160° C. and the pressure of 150 kg/cm² for 30 minutes.

The 90-degree peel strength test was conducted according to the JIS-C 6481, and the result was 2 kg/cm or more at room temperature. Furthermore, the soldering heat resistance was 20 seconds or more at the temperature of 260° C., showing a satisfactory result.

[Eighth Embodiment]

The smooth side (surface roughness: Ra 0.2 μm) of the 18 μm thick roughened electrodeposited copper foil was provided with the surface metal layer of the Pd—P (weight ratio 94:6) to a thickness of 0.5 μm by electroplating. The copper foil of the FR-4 grade glass based epoxy resin copper clad laminate (by Hitachi Chemical Co., Ltd., Tradename: MCL-E67) manufactured so that the smooth side of this copper foil would be the top surface was formed into a conductive circuit (line width 0.1 mm) by etching. Similarly, the smooth sides of the copper foils manufactured by providing them with the Pd—P (weight ratio 94:6) layer were arranged face to face to each other. Then the 0.2 mm thick ethylene propylene diene terpolymer (EPDM) based adhesive sheet shown below was inserted between them. They were laminated and adhered into an integral piece at the temperature of 160° C. and the pressure of 50 kg/cm² for 30 minutes.

Composition of adherent sheet

EPDM (by Sumitomo Chemical Co., Ltd., Esprene 505)—100 parts by weight

White carbon (PPG Industries Co., Ltd., Tradename: HiSil233T)—100 parts by weight Process oil—60 parts by weight Zinc oxide—5 parts by weight Stearic acid—1.0 part by weight Zinc di-n-dibutyldithiocarbamate—2.0 part by weight Tetramethylthiuramdisulfide—0.5 parts by weight 2-mercaptobenzothioazole—1.0 part by weight Sulfur—1.5 parts by weight Said laminate was used to conduct the 90-degree peel strength test according to the JIS-C 6481. The result was 2.3 kg/cm or more at room temperature, 2.3 kg/cm or more after it was immersed in hydrochloride (6N) for one hour, and 1.5 kg/cm or more after it was heated at the temperature of 180° C. for 48 hours. The test result was 2 kg/cm or more after it was dipped in the solder bath having a temperature of 260° C. for 5 seconds. The 90-degree peel strength test was 1.0 kg/cm or more at the high temperature of 150° C. The soldering heat resistance was 15 seconds or more at the temperature of 260° C. All these figures were equal to or better than those in cases where the foils provided with roughing treatment were adhered with the conventional PVB phenolic resin based adherent.

[Nineth Embodiment]

The bonded side of the 1 mm thick silicon steel plate, that of the aluminum substrate, and the smooth side (surface roughness: Ra 0.15 µm) of the 18 µm thick electrodeposited copper foil were each provided with electroless plating by the Pd—P (weight ratio 96:4) to a thickness of 0.4 µm. The EPDM adhesive sheet used in the Embodiment 8 was mounted on the tops of the silicon steel plate and the aluminum substrate provided with Pd—P surface treatment. Furthermore, a 18 µm thick copper foil was mounted on top of it, with the smooth side provided with said surface treatment facing toward the sheet. They were laminated and adhered into an integral piece at the temperature of 160° C. and the pressure of 30 kg/cm² for 30 minutes, thereby obtaining the metal based laminate. The result of the 90-degree peel strength test was conducted according to the JIS-C 6481 was 2 kg/cm or more at room temperature, 2.3 kg/cm or more after it was immersed in hydrochloric acid (6N) for one hour, and 1.5 kg/cm or more after it was heated at the temperature of 180° C. for 48 hours. The test result was 2 kg/cm or more after it was dipped in the solder bath having a temperature of 260° C. for 5 seconds. The 90-degree peel strength test was 1.0 kg/cm or more at the high temperature of 150° C. The soldering heat resistance was 15 seconds or more at the temperature of 260° C. All these figures were equal to or better than those in cases where the rough sides were adhered with the conventional adherent. It should be noted that peel strength was improved after being immersed in hydrochloric acid.

[Tenth Embodiment]

Three types of metal layers—Cu—Zn (30 weight percent Zn), Ni—P (weight ratio 94:6) and Pd—P (weight ratio 94:6)—were formed by electroplating to a thickness of 0.6 µm on the smooth side (surface roughness: Ra 0.2 µm) of the electrodeposited copper foil after the 35 µm thick foil has been produced, the mat side (surface roughness: Ra 1.2 µm) and the mat side provided with roughing particles (surface roughness: Ra 1.5 µm). Two types of the following 0.2 mm thick rubber based adherent sheets are held between these surface metal layers and 6 sheets of FR-4 grade glass cloth based epoxy resin coated cloth. They were laminated and adhered into an integral piece at the temperature of 160° C. and the pressure of 50 kg/cm² for 30 minutes.

Composition of rubber based adherent sheet

1) Hydrogenated nitrile rubber (by Nippon Zeon Co., Ltd., Zetpol 1020)—100 parts by weight Anti aging agent OZ (diphenylamine derivatives)— 2.0 parts by weight Zinc oxide—5.0 parts by weight Stearic acid—1.0 part by weight White carbon (PPG Industries Co., Ltd., HiSil233T)—40 parts by weight Tetramethylthiuramdisulfide (TT)—1.5 parts by weight 2-mercatobenzothioazole (M)—0.5 part by weight Cobalt naphthenate—1.0 part by weight Sulfur—1.5 parts by weight 2) Chloroprene rubber (by Du Pont-Showa Denko Co., Ltd., GW)—100 parts by weight Zinc oxide—18 parts by weight White carbon (PPG Industries Co., Ltd., HiSil233T)—40 parts by weight 2-mercapto-2-imidazolenone (22R)—4 parts by weight Dibenzothiazyldisulfide (DM)—1 parts by weight Tetramethylthiuramdisulfide (TT)—1 part by weight Cobalt naphthenate—1.0 part by weight Sulfur—0.5 parts by weight Said laminate was used to conduct the 90-degree peel strength test according to the JIS-C 6481. The result was 2.0 kg/cm or more at room temperature, 2.5 kg/cm or more after it was immersed in hydrochloride (6N) for one hour, and 1.5 kg/cm or more after it was heated at the temperature of 180° C. for 48 hours. The test result was 2 kg/cm or more after it was dipped in the solder bath having a temperature of 260° C. for 5 seconds. The 90-degree peel strength test was 1.0 kg/cm or more at the high temperature of 150° C. The soldering heat resistance was 15 seconds or more at the temperature of 260° C. Both the shiny side and the mat side were on the same level of practical use as that of the side provided with roughing treatment. Especially, the Pd treatment was found out to be stable and excellent. It should be noted that plating properties after formation of the through-hole was also excellent. The fact that the superb adhesion was ensured on the shiny side as well means that, in adopting the multilayer structure, there is no need of black treatment or control of the surface convex structure which is troublesome in the production of foils for copper foils; furthermore, it shows that roughing is no more necessary. This will make a significant contribution to cost reduction.

[Eleventh Embodiment]

The rubber based adherent comprising the triazinethiol as vulcanizing agent mixed at the ratio illustrated in Table 1 was cross-linked to the shiny side of the 35 µm thick electrodeposited raw copper foil having a surface metal layer by Ni—P electroplating (94 weight percent Ni, 0.5 µm thick), and the copper clad laminate was produced. The following describes this example:

The rubber with the mixing rate illustrated in Table 1 was kneaded by the calender roll to produce 0.2 mm thick sheets.

Various types of rubber sheets shown in Table 1 were mounted on seven sheets of coated paper for FR-1 grade paper based phenol resin copper clad laminate (MCL437F) by Hitachi Chemical Co., Ltd.; they are further mounted in contact with the treated side of the said copper foil. They are laminated and adhered into an integral piece at the temperature of 160° C. and the pressure of 150 kg/cm² for 30 minutes.

Said laminate was used to conduct the 90-degree peel strength test according to the JIS-C 6481. The result was 2.0 kg/cm or more at room temperature (standard value 2.00±0.30), 2.5 kg/cm or more after it was immersed in hydrochloride (6N) for one hour (standard value, deterioration rate: 10% or less), and 1.5 kg/cm or more after it was heated at the temperature of 180° C. for 48 hours. The test result was 2 kg/cm or more (standard value 2.00±0.30) after it was dipped in the solder bath having a temperature of 260° C. for 5 seconds. The 90-degree peel strength test was 1.0 kg/cm or more at the high temperature of 150° C. (standard value 0.45 or more). The soldering heat resistance was 20 seconds or more at the temperature of 260° C. (standard value 15 or more). Thus, the product sufficiently satisfied the specified standards. NO. 2 to NO. 4 with triazines added but without sulfur being mixed exhibited similar excellent properties. They all tended to show improved properties after they were dipped in hydrochloride.

Co., Ltd., on which the shiny side of the 35 μm thick electrodeposited raw copper foil electroplated with the surface metal layer (to a thickness of 0.5 μm) of Ni—P (94 weight percent Ni) was mounted facing to the rubber. They are laminated and adhered into an integral piece at the temperature of 160° C. and the pressure of 150 kg/cm$^2$ for 30 minutes.

Said laminate was used to conduct the 90-degree peel strength test according to the JIS-C 6481. The result was 2.0 kg/cm or more at room temperature (standard value

TABLE 1

|  | No. 1 | No. 2 | No. 3 | No. 4 | No. 5 | No. 6 | No. 7 | No. 8 | No. 9 |
|---|---|---|---|---|---|---|---|---|---|
| Rubber types | NBR[6] | NBR | NBR | NBR | SBR[7] | EPDM[9] | BR[8] | CR[11] | ACM[10] |
| (Parts by weight) | 100 | 100 | 100 | 100 | 100 | 100 | 100 | 100 | 100 |
| White carbon (HiSil233T) | 50 | 50 | 50 | 50 | 50 | 50 | 50 | 50 | 50 |
| Stearic acid | 1.0 | 1.0 | 1.0 | 1.0 | 1.0 | 1.0 | 1.0 | 1.0 | 1.0 |
| Zinc oxide | 5.0 | 5.0 | 5.0 | 5.0 | 5.0 | 5.0 | 5.0 | 5.0 | 5.0 |
| Sulfur | 1.5 | 0 | 0 | 0 | 1.5 | 1.5 | 1.5 | 1.0 | 1.5 |
| Triazinethiol A-1[1] | 1.0 | 1.0 | 1.0 | 1.0 | 1.0 | 1.0 | 1.0 | 1.0 | 1.0 |
| Triazinethiol B-1[2] |  |  |  | 2.0 |  |  |  |  |  |
| TS[3] | 0.5 |  | 1.0 | 0.5 | 1.0 |  |  | 0.5 |  |
| MBTS[4] |  |  |  |  | 1.0 | 1.0 | 1.0 |  | 1.0 |
| TT[5] |  | 2.0 |  |  |  |  |  |  |  |

[1]Triazinedithiol A-1: 2,4-dimercapto-6-phenylamino-1,3,5-triazine
[2]Triazinedithiol B-1: 2,4,6-trimercapto-1,3,5-triazine
[3]TS: tetramethylthiurammonosulfide
[4]MBTS: dibenzothiazyldisulfide
[5]TT: tetramethylthiuramdisulfide
[6]NBR: by Japan Synthetic Rubber Co., Ltd., Tradename: 2025
[7]SBR: by Japan Synthetic Rubber Co., Ltd., Tradename: 1500
[8]BR: by Nippon Zeon Co., Ltd., Tradename: BR1220
[9]EPDM: by Mitsui Petrochemical Industries, Ltd., Tradename: 4070
[10]ACM: by Japan Synthetic Rubber Co., Ltd., Tradename: AR 420
[11]CR: Denki Kagaku Kogyo Kabushiki Kiasha, Tradename: A-120
[12]Mixing ratio: shown in parts by weight

[Twelveth Embodiment]

The rubbers having the mixing compositions shown in Table 2 were kneaded and formed into sheets having a thickness of 0.2 mm by a calender roll.

2.00±0.30), 2.5 kg/cm or more after it was immersed in hydrochloric acid (6N) for one hour (standard value, deterioration rate: 10% or less), and 1.5 kg/cm or more after it was heated at the temperature of 180° C. for 48 hours. The

TABLE 2

|  | No. 1 | No. 2 | No. 3 | No. 4 | No. 5 |
|---|---|---|---|---|---|
| Rubber types | NBR[1] | Hydrogenated[2] nitrile rubber | Hydrogenated nitrile rubber | Hydrogenated nitrile rubber | EPDM[3] rubber |
| (Parts by weight) | 100 | 100 | 100 | 100 | 100 |
| BR[4] | 20 | 20 | 20 | 20 | 20 |
| White carbon (HiSi1233) | 50 | 50 | 50 | 50 | 50 |
| Stearic acid | 1.0 | 1.0 | 1.0 | 1.0 | 1.0 |
| Triazinedithiol A-1 | 2.0 | 3.0 |  |  | 2.0 |
| Triazinedithiol C-1[5] |  |  | 3.0 | 3.0 |  |
| Peroxide DCP[6] |  |  | 3.0 |  |  |
| Percadox14[7] |  | 3.0 |  | 3.0 |  |
| Perhexa25B[8] |  |  |  |  | 3.0 |

[1]NBR: by Japan Synthetic Rubber Co., Ltd., Tradename: 2025
[2]Hydrogenated nitrile rubber: Nippon Zeon Co., Ltd. Tradename: 2020
[3]EPDM rubber: by Mitsui Petrochemical Industries, Ltd., Tradename: 4010
[4]BR: by Nippon Zeon Co., Ltd., Tradename: BR1220L
[5]Triazinedithiol C-1: 2,4-dimercapto-6-acrylamino-1,3,5-triazine
[6]DCP: dicumyl peroxide
[7]Percadox 14: α,α'-bis (t-butylperoxisoproryl) benzen
[8]Perhexa 25B: 2,5-dimethyl-2,5-di(t-butyl peroxy)hexane
[9]Mixing ratio: shown in parts by weight Various types of rubber sheets were mounted on seven sheets of coated paper for FR-1 grade paper based phenol resin copper clad laminate (MCL437F) by Hitachi Chemical test result was 2 kg/cm or more (standard value 2.00±0.30) after it was dipped in the solder bath having a temperature of 260° C. for 5 seconds. The 90-degree peel strength test was 1.0 kg/cm or more at the high temperature of 150° C. (standard value 0.45 or more). The soldering heat resistance was 20 seconds or more at the temperature of 260° C. (standard value 15 seconds or more). Thus, the product sufficiently satisfied the specified standards. The excellent properties were also exhibited when triazinethiols without inorganic sulfur was added. They all tended to show improved and stabilized properties after they were dipped in hydrochloric acid (from 2 kg/cm to 3 kg/cm).

[Thirteen Embodiment]

The side of the 18 μm thick rolled copper foil (surface roughness: Ra 0.15 μm) was provided with Ni—P layer (weight ratio 94:6) by electroplating to a thickness of 0.5 μm. Then ethylenepropylenediene terpolymer (EPDM 4010 by Mitsui Petrochemical Industries, Ltd., 63 weight percent ethylene, 10.6 weight percent diene (EBN), Mooney viscosity $ML_{1+4}$ (100° C.)8) was mixed with the general-purpose polybutadiene (Nipol BR1220L by Nippon Zeon Co., Ltd.) and liquid polybutadiene (NiSSO-PB-PB3000 by Nippon Soda Co., Ltd.) in various mixing ratios as shown in Table 3, and produced 51 types of adherent compositions comprising combinations of sulfur vulcanization derivatives shown in Table 4 and two types of peroxide vulcanization derivatives shown in Table 5. They were then dissolved in the mixture of toluene and xylene (50 to 50 in weight ratio) to produce adherent varnish. They were coated on the treated side of the copper foil having the surface metal layer of said Ni—P to form about 20 μm thick films. The bonded side of the said copper foils were heaped on seven sheets of coated paper for FR-1 grade paper based phenol resin copper clad laminate (MCL437F) by Hitachi Chemical Co., Ltd. so as to face the coated paper side, thereby producing the one-sided copper clad laminates and both-sided copper clad laminates at the temperature of 170° C. and the pressure of 150 kg/cm² for 40 minutes, according to the conventional method.

Table 6 shows the result of the test conducted according to the JIS-C 6481, using said laminates. It has bee revealed that both peel strength and soldering heat resistance are better than those of the conventional adherents. Furthermore, the adherents used in the present invention are coated on the smooth copper foil; this allows the used amount of coating to be reduced to ½ to ⅕ of that in the conventional adherents which are coated on the rough surfaces, making a contribution in cost reduction.

The compositions mainly comprising EPDM featuring excellent anti-tracking property (Nos. 1, 2, 3, 5, 6, 8, 9, 10, 11 and 12) are characterized by superb anti-tracking property as measured according to UL Subject 746A. The conventional adherents contain inorganic additives such as aluminum hydroxide and melamine to improve the anti-tracking property. They are difficult to coat and are less smooth, thereby causing yields to be deteriorated. By contrast, the adherent according to the present invention, completely free of such problems, provides a high yield in coating works.

TABLE 3

| Mixed materials | 1 | 2 | 3 | 4 | 5 | 6 | 7 | 8 | 9 | 10 | 11 | 12 | 13 | 14 | 15 | 16 | 17 |
|---|---|---|---|---|---|---|---|---|---|---|---|---|---|---|---|---|---|
| | | | | | | | | Mixing ratio (parts by weight) | | | | | | | | | |
| Ethylene propylene diene terpolymer (EPT 4010 by Mitsui Petrochemical Industries, Ltd.) | | | | | | | | 100 | | | | | | 0 | | | |
| Polybutadiene (Nipol BR-1220L by Nippon Zeon Co., Ltd.) | 0 | 25 | 50 | 75 | 0 | 0 | 0 | 0 | 0 | 0 | 0 | 0 | 0 | 100 | 0 | 0 | 0 |
| Liquid polybutadiene | | | | | | | | | | | | | | | | | |
| NiSSO - PB - PB3000 (by Nippon Soda Co., Ltd.) | 0 | 0 | 0 | 0 | 25 | 50 | 75 | 0 | 0 | 0 | 0 | 0 | 0 | 0 | 100 | 0 | 0 |
| LPB - 3000 (by Nippon Petrochemical Co., Ltd.) | 0 | 0 | 0 | 0 | 0 | 0 | 0 | 25 | 50 | 75 | 0 | 0 | 0 | 0 | 0 | 100 | 0 |
| R - 45HT (by Idemitsu Petrochemical Co., Ltd.) | 0 | 0 | 0 | 0 | 0 | 0 | 0 | 0 | 0 | 0 | 25 | 50 | 75 | 0 | 0 | 0 | 100 |

TABLE 4

| No. | Vulcanizing agent and vulcanization accelerator | | Mixing ratio (with respect to 100 parts by weight of rubber) |
|---|---|---|---|
| 1 | Noccler M* | 2-mercaptobenzothiazole | 1.0 |
| | Noccler TT* | Tetramethylthiuramdisulfide | 1.5 |
| | Noccler TS* | Tetramethylthiurammonosulfide | 1.5 |
| | Noccler BZ* | Zinc dibutyldithiocarbamate | 1.0 |
| | | Sulfur | 4.0 |

*Manufactured by Ouchi Shinko Chemical Industries, Ltd.

TABLE 5

| No. | Vulcanizing agent and vulcanization accelerator | | Mixing ratio (with respect to 100 parts by weight of rubber) |
|---|---|---|---|
| 1 | Percumyl-D | Dicumylperoxide | 5.0 |
|   | Nocrac MB | 2-mercaptobenzimidazole | 0.5 |
|   | Triazinethiol A-1 | 2,4-dimercapto-6-phenylamino 1,3,5-triazine | 1.0 |
| 2 | Percumyl-D | Dicumylperoxide | 2.7 |
|   | Acrylester | Ethyleneglycole dimethacrylate | 2.0 |
|   | Vesta PP | Wet type synthetic calcium oxide | 5.0 |
|   | Triazinethiol B-1 | 2,4,6-trimercapto-1,3,5-triazine | 2.0 |

The following describes the manufacturers of peroxide vulcanization derivatives in Table 5:

Percumyl-D: NOF CO., (U.K.)

Nocrac MB: Ouchi Shinko Chemical Industries, Ltd.

Triazinethiol A-1: Sankyo Kasei Co., Ltd.

Acrylester: Shin Nakamura Chemical Co., Ltd.

Triazinethiol B-1: Sankyo Kasei Co., Ltd.

[Fourteen Embodiment]

The present inventors produced copper clad laminates using 15 types of adherent components according to the same materials and production methods as those in Tables 4 and 5 of Embodiment 13, in addition to the major adherent components given in Table 7. The peel strength at room temperature, peel strength after 48 hours at 180° C., soldering heat resistance and hydrochloride resistance measured according to the JIS-C 6481 were as excellent as the properties of the examples of the present invention shown in Table 6. Nos. 3 to 5 having an EPDM mixing ratio of 50 weight percent or more exhibited excellent anti tracking property of 200 drops or more.

TABLE 7

| Material | | Mixing | | | | |
|---|---|---|---|---|---|---|
| | | No. 1 | No. 2 | No. 3 | No. 4 | No. 5 |
| | | Mixing ratio (parts by weight) | | | | |
| Ethylene propylene diene terpolymer | EPT 4010 by Mitsui Petrochemical Industries, Ltd. | 0 | 25 | 50 | 75 | 100 |
| Styrene butadiene rubber | Nipol 1507 by Nippon Zeon Co., Ltd. | 100 | 75 | 50 | 25 | 0 |

TABLE 6

| | | Adherent | |
|---|---|---|---|
| | | Example of conventional adherents (copper clad laminate using the butyral-phenol based adherent**) | Example of the present invention (copper clad laminate using the adherents of the present invention) |
| Amount of coating | g/m2 | 25 to 40 | 10 to 15 |
| Volatile matter | % | 3.5 ± 3 | 0.5 ± 0.2 |
| Peel at room temperature | kg/cm | 1.8 to 2.1 | 3 to 5 |
| Peel after 48 hours at 180° C. | kg/cm | 1.0> | 2.5–3.5 |
| Soldering heat resistance | s/260° C. | 11 to 15 | 20< |
| Hydrochloride resistance | % | −0.9 to −2.8 | +1.5 to 2 |
| Anti tracking property* | drop | 180 ± 15 | 200< |

*Anti tracking property of the composition wherein EDPM is 50 weight percent or less
**Rough side of the electrodeposited copper foil used (35 μm thick with surface roughness Ra of 1.5 μm)

[Fifteen Embodiment]

The one side of the 18 μm thick rolled copper foil (surface roughness: Ra 0.15 μm) was provided with electroplated Pd—P (weight ratio 94:6) to a thickness of 0.5 μm. Used as the major adherent components, (I) 100 parts by weight of polybutadiene (Nipol BR1220L by Nippon Zeon Co., Ltd., (II) 20 parts by weight of liquid polybutadiene (LPB-300 by Nippon Petrochemical Co., Ltd.), (III) 1.0 part by weight of 2-mercaptobenzimidazole (Noccler M by Ouchi Shinko Chemical Industries, Ltd.), (IV) 1.5 parts by weight of tetramethylthiuramdisulfide (Noccler TT by Ouchi Shinko Chemical Industries, Ltd.), (V) 1.5 parts by weight of tetramethylthiurammonosulfide (Noccler TS by Ouchi Shinko Chemical Industries, Ltd.), and (VI) 4.0 parts by weight of sulfur powder were then dissolved in the mixture of toluene and xylene (50 to 50 in weight ratio) to produce adherent varnish. They were coated on the palladium-treated side of the said copper foil to form about 15 μm thick films. This was placed on the four prepregs of glass fabric based BT resin 810 (epoxy modified cyanoester resin by Mitsubishi Gas Chemical Company) so that the bonded sides face each other, thereby producing the one-sided copper clad laminates and both-sided copper clad laminates at the temperature of 170° C. and the pressure of 100 kg/cm² for 40 minutes, according to the conventional method.

Said laminates were used to conduct the measurement according to the JIS-C 6481. The result was as excellent as shown in Table 6. The anti-tracking property measured according to UL Subject 746A exhibited an excellent result of 200 drops or more, sufficiently meeting the requirements. They were shown to be suited to high frequency application in the transfer test of a high frequency waveform of 1 GHz or more without producing waveform distortion.

[Sixteen Embodiment]

The raw foil S side of the 35 μm thick electrodeposited copper foil (surface roughness: Ra 0.2 μm) was provided with Ni—P layer (weight ratio of 94:6) by electroplating to a thickness of 0.5 μm. Then three types of compounds—(I) 75 parts by weight of ethylen buten diene terpolymer (EBDM K9720 by Mitsui Petrochemical Industries) and 25 parts by weight of liquid polybutadiene (LPB-3000 by Nippon Petrochemical Co., Ltd.), (II) 100 parts by weight of butyl rubber (JSR Butyl 365 by Japan Synthetic Rubber Co., Ltd., and (III) 100 parts by weight of polybutadiene (Nipol BR 1220L by Nippon Zeon Co., Ltd.—were each dissolved in in xylene to produce 20 to 25 weight percent solutions. They were mixed with vulcanization accelerator and vulcanizing agent shown in Table 4 of Embodiment 13 and were carefully stirred to get them sufficiently dispersed.

Said three types of compounds were coated on the Ni—P treated side of said copper foil and were dried to form 10 to 25 μm thick adherent films. Seven sheets of coated paper for FR-1 grade paper based phenolic resin copper clad laminate (MCL437F) by Hitachi Chemical Co., Ltd. were placed on the bonded sides of these copper foils coated with adherent, thereby producing the one-sided copper clad laminates and both-sided copper clad laminates at the temperature of 170° C. and the pressure of 150 kg/cm$^2$ for 40 minutes.

Said laminates were used to conduct the measurement according to the JIS-C 6481. The result was as excellent as shown in Table 6; they were proven to have excellent peel strength and anti-tracking property.

[Seventeen Embodiment]

Nos. 1 to 4 given in Table 8 and combinations of all the vulcanizing agents shown in Tables 4 and 5 of Embodiments 13 (mixing ratio was given with respect to 100 parts by weight of resin component, similar to the case of EPDM) were used to form 50 weight percent methylethylketone solution. They are used to impregnate glass cloth (WEA18W105F115, E glass by Nitto Boseki Co., Ltd.) to produce coated cloth (amount of coating: 40 to 45 weight percent). The smooth side of the 18 μm thick electrodeposited copper foil (surface roughness: Ra 0.30 μm) was provided with Ni—Zn layer (60 weight percent zinc) by electroplating to a thickness of 0.5 μm. This foil was placed on the four sheets of coated cloth produced above with the Ni—Zn side facing downward, and was heated and pressed to form laminates at the temperature of 170° C. and the pressure of 100 kg/cm$^2$ for one hour.

Said copper clad laminates were used to make evaluation according to the JIS-C 6481. The peel strength at room temperature and peel strength after 48 hours at 180° C. were 2.0 kg/cm or more. This figure was superior to 1.3 kg/cm which represents the peel strength at room temperature for the conventional epoxy resin copper clad laminates using the copper foils provided with roughing treatment.

TABLE 8

| Material | Mixing Mixing ratio (parts by weight) | | | |
|---|---|---|---|---|
| | No. 1 | No. 2 | No. 3 | No. 4 |
| Phenolic resin, PP-700-300 by Nippon Petrochemical Co., Ltd. | 40 | 30 | 20 | 0 |
| High brominated bisphenol A | 32.8 | 24.6 | 16.4 | 0 |

TABLE 8-continued

| Material | Mixing Mixing ratio (parts by weight) | | | |
|---|---|---|---|---|
| | No. 1 | No. 2 | No. 3 | No. 4 |
| type epoxy resin YOB 400 by Tohto Kasei Co., Ltd. | | | | |
| Novolak type epoxy resin, YOCN 704 by Tohto Kasei Co., Ltd. | 7.2 | 5.4 | 3.6 | 0 |
| 2-phenyl-4-methyl-5-hydroxymethylimidazol, 2P4MHZ by Shikoku Chemicals Co., Ltd. | 0.16 | 0.12 | 0.08 | 0 |
| Polybutadiene[1)2)3)4)] | 20 | 40 | 60 | 100 |

[1)]Nipol BR 1220L by Nippon Zeon Co., Ltd.
[2)]NiSSO PB-R-3000 by Nippon Soda Co., Ltd.)
[3)]LPB B-3000 by Nippon Petrochemical Co., Ltd.
[4)]Poly Bd R45-HT by Idemitsu Petrochemical Co., Ltd.

[Eighteen Embodiment]

Epoxy resin compositions Nos. 1 to 4 given in Table 9 and combinations of all vulcanization accelerators and vulcanizing agents shown in Tables 4 and 5 (mixing ratio was given with respect to 100 parts by weight of resin component) were used to form 50 weight percent methylethylketone solution. They are used to impregnate glass cloth (WEA18W105F115, E glass by Nitto Boseki Co., Ltd.) to produce coated cloth (amount of coating: 40 to 45 weight percent). In the meantime, the drum side (S side) of the 18 μm thick copper foil (surface roughness: Ra 0.30 μm) was provided with Ni—P layer (about 94 weight percent Ni) by electroplating to a thickness of 0.5 μm. This foil was placed on the four sheets of coated cloth produced above with the Ni—P side facing downward, and was heated and pressed to form laminates at the temperature of 170° C. and the pressure of 100 kg/cm$^2$ for one hour.

Said copper clad laminates were used to make evaluation according to the JIS-C 6481. The peel strength at room temperature and peel strength after 48 hours at 180° C. were 2.0 kg/cm or more. This figure was much superior to 1.3 kg/cm which represents the corresponding value of the conventional examples, clearly indicating the superior vulcanizing effect of the metal and adherent.

TABLE 9

| Material | Mixing Mixing ratio (parts by weight) | | | |
|---|---|---|---|---|
| | No. 1 | No. 2 | No. 3 | No. 4 |
| Brominated bisphenol A type epoxy resin, EPICLON 1120Z-80M | 80 | 80 | 80 | 80 |
| Cresol novolak type epoxy resin, EPICLON N-673-70M | 20 | 20 | 20 | 20 |
| Dicyandiamide, DICY | 2.6 | 2.6 | 2.6 | 2.6 |
| Polybutadiene[1),2)] | 20 | 30 | 40 | 60 |

[1)]NiSSO PB-G-2000 by Nippon Soda Co., Ltd.
[2)]Poly Bd R45 EPT by Idemitsu Petrochemical Co., Ltd.

[Nineteen Embodiment]

BT resin compositions Nos. 1 to 4 given in Table 10 and combinations of all vulcanization accelerators and vulcanizing agents shown in Tables 4 and 5 (48 types, mixing ratio was given with respect to 100 parts by weight of resin component) were used to form 50 weight percent methylethylketone solution.

The same type of the E glass cloth as that used in Embodiment 17, was immersed in the varnish and dried to form the coated cloth (amount of coating: 40 to 45 weight percent). Four sheets of coated cloth were laminated to produce the copper clad laminates according to Embodiment 18.

Said copper clad laminates were used to make evaluation according to the JIS-C 6481. The peel strength at room temperature and peel strength after 48 hours at 180° C. were 2.0 kg/cm or more. This figure was superior to the peel strength of the conventional laminate at room temperature by 1.6 kg/cm or more, and to the peel strength after 48 hours at 180° C. by 1.3 kg/cm or more, clearly indicating the superior vulcanizing effect of the metal and adherent.

TABLE 10

| Material | Mixing Mixing ratio (parts by weight) | | | |
|---|---|---|---|---|
| | No. 1 | No. 2 | No. 3 | No. 4 |
| BT resin[1] | 55 | 44 | 33 | 22 |
| Brominated epoxy resin, YDB-500[2] | 45 | 36 | 27 | 18 |
| Zinc octylate | 0.01 | 0.008 | 0.006 | 0.004 |
| Dicumyl peroxide | 0.10 | 0.08 | 0.06 | 0.04 |
| Polybutadiene[3] | 0 | 20 | 40 | 60 |

[1]<1> BT2170, <2> BT2177 by Mitsubishi Gas Chemical Company
[2]Tohto Kasei Co., Ltd.
[3]<1> PB-BF-1000 (Partially epoxidized liquid butadiene) and <2> PB-EPB-B (liquid polybutadiene comprising carboxyl end group modified by epoxy resin by Nippon Soda Co., Ltd.

As will be clear from the said embodiments, the present invention has the following effects: Anchor effect has been used to improve adhesion strength between the copper foil and the insulation layer, and this has prevented the circuit from being made narrowed. The first effect of the present invention is that it is possible to use the copper foil not provided with roughing treatment, since powerful adhesion strength by direct vulcanization is ensured for the smooth side of the copper foil where anchor effect cannot be expected. Elimination of the need of roughing treatment reduces the process and improves yields, which, in turn, reduces copper foil production cost, hence copper clad laminate production cost. Furthermore, powerful adhesion strength by direct vulcanization is ensured for the rolled copper foil where formation of large roughing particles is difficult. This has made it possible to use the rolled copper foil for the copper clad laminate.

The second effect of the present invention is a decreased adherent material cost and reduced amount of coating. The amount of coating is greatly reduced because less costly general-purpose rubber can be used, and the adherent can be applied to the smooth side of the copper foil. Whereas the thickness of the coated film is 20 to 30 μm in the prior art, the coated film thickness is only ½ to ⅕ of that value in the case of the adhesive used according to the present invention.

The first effect of the present invention on improvement of characteristics is its contribution to fine patterning. If the copper foil having a smooth side not provided with roughing treatment is used as the copper foil of the copper clad laminate according to the present invention, it is possible to form a 20 μm wide (18 μm thick) circuit, far exceeding the conductor spacing of 0.1 mm, which has been the limit of circuit formation in conventional etching; hence contributing to fine patterning. In the production of multilayer circuit boards comprising the glass cloth epoxy resin and the like, the present invention eliminates the need of black treatment on the shiny side of the copper foil intended for improving adhesion property, which causes the yield to be reduced. The resulting removal of the black treatment process ensures improved yields and reduced costs.

The second effect is that the present invention provides excellent anti-tracking property. When the materials having a superb anti-tracking property or ethylene propylene diene terpolymer having an extremely good anti-tracking property is used, inorganic additives or to add much melamine is added in the case of conventional adherents to improve anti-tracking property; therefore, the sliding between foils is not smooth, resulting in uneven coating. This has been a problem for a long period of time. By contrast, the ethylene propylene diene terpolymer having excellent anti-tracking property among the nonaromatics and non-polar polymers can be used for the adherent used according to the present invention, thereby eliminating the need of using the inorganic additives and improving the coating work efficiency.

The third effect is that the present invention allows use of the copper foil having smooth sides both on the front and back, thereby reducing high frequency signal waveform distortion. This will solve one of the critical problems in the growing communications technologies, making a significant contribution to the extended use of printed circuit boards in the field of high frequency applications.

As discussed above, the advantages due to innovative changes of is between the insulating layer and copper foil cover an extensive range of product performances and production technologies.

What is claimed is:

1. A copper clad laminate having a bonded side between a copper foil and an insulating layer adhered to each other by lamination, wherein the copper foil has a metal layer on a side to be bonded with the insulating layer, wherein the metal layer comprises an alloy selected from the group consisting of Cu—Zn alloy, Ni—Zn alloy, Ni—Sn alloy, Ni—Cu alloy, Pd—P alloy and Ni—P alloy, and the metal layer and insulating layer are cross linked with each other by chemical bonds through sulfur atoms.

2. A copper clad laminate according to claim 1, the copper foil is 3 to 500 μm thick manufactured by rolling or electrodeposition and the metal layer is 0.01 to 5 μm thick.

3. A copper clad laminate according to claim 1 wherein the insulating layer is a cross-linked adhesive layer formed by cross-linking an adherent containing a compound having vulcanizable unsaturated bonding and at least one vulcanizing agent selected from the group consisting of sulfur and sulfur donors.

4. A copper clad laminate according to claim 1 wherein the insulating layer is a cross-linked adhesive layer formed by cross-linking an adherent containing a compound having vulcanizable unsaturated bonding, at least one thiol for vulcanization and at least one peroxide.

5. A copper clad laminate according to claim 3 wherein the adherent contains a vulcanization accelerator.

6. A copper clad laminate according to claim 3 wherein the compound having vulcanizable unsaturated bonding is ethylene-α-olefine copolymer obtained by copolymerization of ethylene, α-olefine, and dienes.

7. A copper clad laminate according to claim 6 wherein the ethylene-α-olefine copolymer is ethylene propylene diene terpolymer or ethylene butene diene terpolymer.

8. A copper clad laminate according to claim 3 wherein the adherent contains at least one substance selected from the group consisting of natural rubber, isoprene rubber, styrene butadiene copolymer, polybutadiene, butyl rubber, acrylonitrile butadiene copolymer, halogenated butyl rubber, chloroprene rubber, and acrylic rubber.

9. A copper clad laminate according to claim 3 wherein an insulating substrate is adhered by lamination to the cross-linked adhesive layer.

10. A copper clad laminate according to claim 3 wherein a metal substrate is adhered by lamination to the cross-linked adhesive layer.

11. A copper clad laminate according to claim 3 wherein the adherent includes 0.1 to 30 parts by weight of the at least one vulcanizing agent per 100 parts by weight of the compound having vulcanizable unsaturated bonding.

12. A multilayer printed circuit board according to claim 3 wherein said at least one vulcanizing agent is a sulfur donor, said sulfur donor being a thiol.

13. A copper clad laminate according to claim 1 wherein the insulating layer is an insulating substrate formed by cross-linking an adhesive-impregnated substrate impregnated with an adherent containing a compound having vulcanizable unsaturated bonding and at least one vulcanizing agent selected from the group consisting of sulfur and sulfur donors.

14. A multilayer printed circuit board according to claim 13 wherein said at least one vulcanizing agent is a sulfur donor, said sulfur donor being a thiol.

15. A copper clad laminate according to claim 1 wherein said laminate has been immersed in hydrochloric acid or salts thereof.

16. A copper clad laminate according to claim 1 wherein said metal layer has a thickness of at most 5 μm.

17. A copper clad laminate according to claim 1 wherein the surface of the copper foil to which the metal layer is adhered has not been subjected to a roughening process.

18. A copper clad laminate according to claim 1 wherein the insulating layer is an adhesive layer having a thickness of 5–1000 μm.

19. A multilayer printed circuit board having multilayered circuit copper foils laminated with insulating layers, said copper foils and said insulating layers being alternated with each other, the improvement wherein each of said multilayered circuit copper foils has a metal layer on its surface adhering to one of said insulating layers, wherein the metal layer comprises an alloy selected from the group consisting of Cu—Zn alloy, Ni—Zn alloy, Ni—Sn alloy, Ni—Cu alloy, Pd—P alloy and Ni—P alloy, and the metal layers and insulating layers are cross-linked by chemical bonds through sulfur atoms.

20. A multilayer printed circuit board according to claim 19 wherein the insulating layers comprise an insulating adherent containing a compound having vulcanizable unsaturated bonding and at least one vulcanizing agent selected from the group consisting of sulfur and sulfur donors.

21. A multilayer printed circuit board according to claim 19 wherein the insulating layers comprise an adhesive-impregnated substrate impregnated with an unsulating adherent containing a compound having vulcanizable unsaturated bonding and at least one vulcanizing agent selected from the group consisting of sulfur and sulfur donors.

22. A multilayer printed circuit board according to claim 19 wherein said printed circuit board has been immersed in hydrochloric acid or salts thereof.

23. A multilayer printed circuit board according to claim 20 wherein said at least one vulcanizing agent is a sulfur donor, said sulfur donor being a thiol.

24. A multilayer printed circuit board according to claim 21 wherein said at least one vulcanizing agent is a sulfur donor, said sulfur donor being a thiol.

* * * * *